United States Patent [19]

Miller

[11] Patent Number: 4,595,888
[45] Date of Patent: Jun. 17, 1986

[54] PRE-DISTORTION SHAPING NETWORK

[75] Inventor: Brian M. Miller, Spokane, Wash.

[73] Assignee: Hewlett Packard Company, Palo Alto, Calif.

[21] Appl. No.: 602,650

[22] Filed: Apr. 23, 1984

[51] Int. Cl.<sup>4</sup> .............................................. H03C 3/08
[52] U.S. Cl. ................................. 332/18; 331/177 V; 332/30 V; 455/63
[58] Field of Search ........... 331/177 V; 332/18, 30 V; 455/63

[56] References Cited

U.S. PATENT DOCUMENTS

4,003,004  1/1977  Fletcher et al. ................. 332/18 X

Primary Examiner—Eugene R. LaRoche
Assistant Examiner—James C. Lee
Attorney, Agent, or Firm—Leslie G. Murray

[57] ABSTRACT

A pre-distortion shaping network employing a field effect transistor as one leg of a resistive voltage divider for shaping the modulating signal of a voltage controlled oscillator is described.

13 Claims, 10 Drawing Figures

PRE-DISTORTION SHAPING NETWORK

BACKGROUND AND SUMMARY

Distortion in the modulation of a voltage-controlled oscillator (VCO) is a well-known problem. Frequently, a non-linear shaping function is employed to shape the modulating signal of a VCO for reducing distortion in the frequency modulation (FM) component of the output signal of the VCO.

Figure 1:
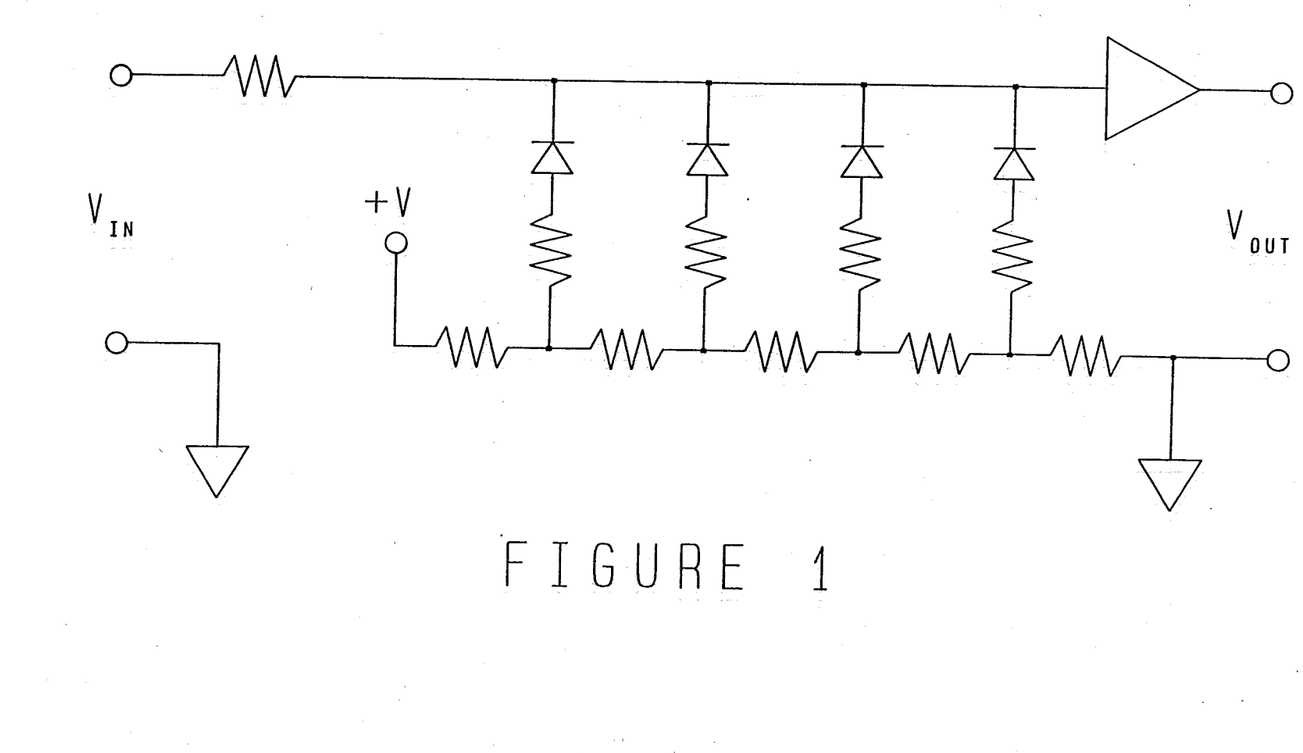
FIG. 1 is a schematic of one prior art pre-distortion network which includes a diode-resistor network.

One prior art shaping function utilizes a diode-resistor network such as that shown in FIG. 1. The resistors are typically selected for reduced distortion in VCO output which is time consuming and expensive. Distortion specifications for VCO's which employ such a network, range from about −29 dB to about −54 dB.

Figure 2:
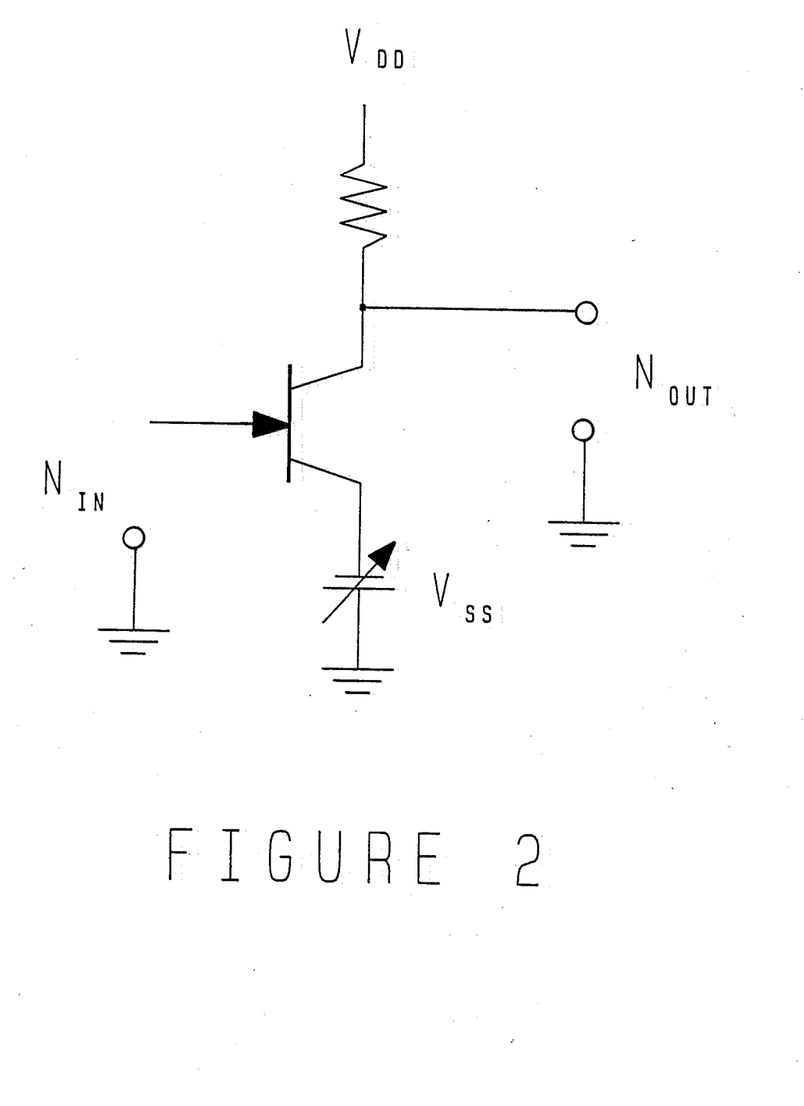
FIG. 2 is a schematic of another prior art pre-distortion network which employs the $V_{GS}$-$I_D$ characteristic of an FET biased to the saturation region thereof.

In another prior art shaping network shown in FIG. 2, the $V_{GS}$-$I_D$ characteristic of a field-effect transistor (FET) is used to pre-distort the modulating signal of a VCO to reduce distortion. Since the FET operates in the saturated region of its characteristic, the non-linearity achievable for modulation of the VCO is essentially uncontrollable because it cannot be reduced below a computable minimum. Thus, VCO output distortion is typically no better than about −30 dB.

In the present invention, the non-linear resistance of an FET is employed as one leg of a resistive voltage divider network. The output of this network is also used to pre-distort a VCO modulation signal. However, this network relies on the $V_{DS}$-$I_D$ characteristic of the FET which is biased to operate in the linear region of that characteristic. Therefore, nearly any degree of controllable pre-distortion may be achieved.

A pre-distortion shaping network constructed according to the principles of the present invention provides a second order voltage transfer function, the first and second order coefficients of which may be independently selected. The non-linearity of that voltage transfer function is approximately equal to the inverse of the VCO frequency modulation transfer function non-linearity.

The shaping network of the present invention provides at least 30 dB improvement in VCO FM distortion. Typically, −90 dB distortion is obtainable.

DESCRIPTION OF THE PREFERRED EMBODIMENT

An analysis of the non-linear shaping function required by a typical VCO to produce substantially distortion-free FM output signals, shows that the pre-distortion shaping required is predominantly second order and is given by the following relation:

Equation A
$$g(v) = V - \left[ \frac{1+\sigma}{2} - \frac{3\sigma}{4\left(1 + \frac{C_p}{C_{AV}}\right)} \right] \cdot \frac{V^2}{\phi + V_o}$$

The derivation of equation A is given in Exhibit A to this specification. The analysis is not necessary to understand the operation of the FET shaping network of the present invention, but is required to design such a shaping network for a particular VCO.

Figure 3A:
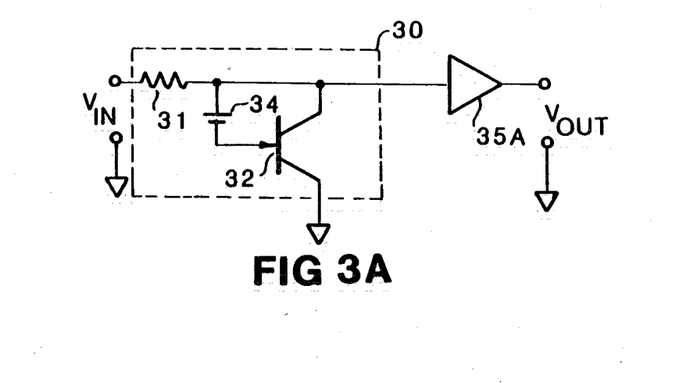
FIGS. 3A, 3B, 3C and 3D are schematics of pre-distortion shaping networks constructed according to the principles of the present invention.
Figure 3B:
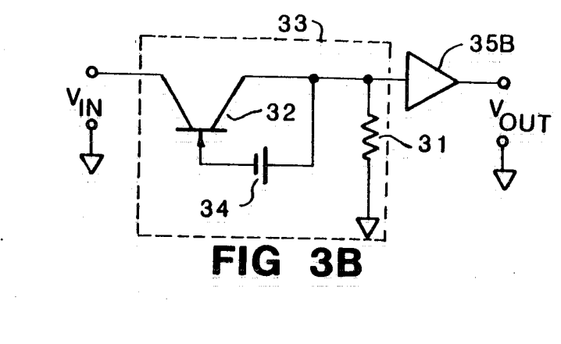
Figure 3C:
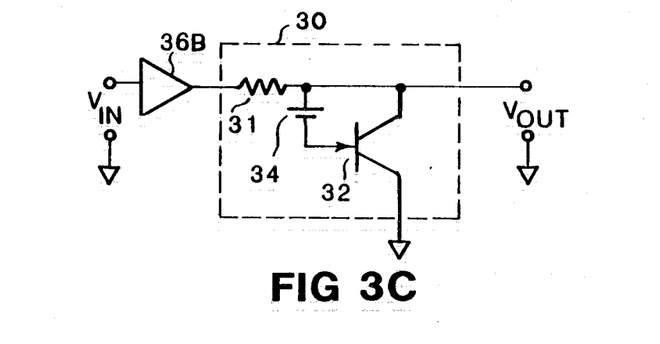

The transfer function of the FET shaping network 30 (as shown in FIGS. 3A and 3C) of the present invention is given by the relation:

$$V_{out} = \frac{R_{ON}}{R_{ON} + R} \cdot V_{in} - \left[ \frac{R_{ON}^2 R}{2|V_p|(R_{ON} + R)^3} \right] V_{in}^2$$

Where $R_{ON}$ is the resistance of the drain to sink junction of semiconductor device 32 evaluated when the gate-to-sink voltage is zero; i.e., $V_{GS}=0$ (see Exhibit B, page 16);

where R is the resistance of resistor 31 (as shown in FIGS. 3A–3D);

where $V_p$ is the pinch-off voltage for semiconductor device 32 (as shown in FIGS. 3A–3D); and where $V_{in}$ and $V_{out}$ are the input voltage and output voltage, respectively, of the shaping network 30 and 33 (as shown in FIGS. 3A–3D).

The derivation of equation B is given in Exhibit B to this specification.

Figure 3D:
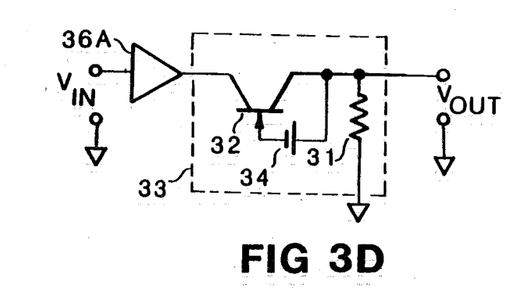

The transfer function of the FET shaping network 33 (as shown in FIGS. 3B and 3D) of the present invention is given by the relation:

Equation C
$$V_{out} = \frac{R}{R + R_{ON}} \cdot \left[ V_{in} - \frac{R_{ON}^2}{2|V_p|(R + R_{ON})^2} V_{in}^2 \right]$$

The derivation of equation C is given in Exhibit C to this specification.

The close match between equations A and B and A and C indicate that the FET shaping network of the present invention very closely approximates the shaping required to linearize the output FM modulation of the VCO signal.

A comparison of equations A and B also shows the improvement of the present invention over traditional prior art diode-resistor shaping network. Such networks provide a transfer function comprised of interconnected straight-line segments having break points at the interconnection which approximate the desired curve. The more break points, the better the approximation, and many such break points are required to suppress higher order terms of the transfer function which are also produced by the network. The FET shaping network provides a transfer function having no break points and is inherently low in higher order terms.

The shaping networks 30, 33 of FIGS. 3A–3D are resistive voltage dividers a semiconductor device, 32 namely an FET, resistor 31 and voltage source 34. Semiconductor device 32 is employed as one of the two resistances in the divider. Two basic configurations of the divider are provided; divider 30 in FIGS. 3A and 3C are the same but different from dividers 33 in FIGS. 3B and 3D. Such networks are utilized to shape the modulating signal of a VCO to reduce distortion in the FM component of the output signal of a VCO.

The shaping network of the present invention attenuates its input voltage because it is a voltage divider. However, often it is desirable to have a shaper circuit with at least unity gain. Such gain may be achieved by amplifying the output signal from the divider network as shown in FIGS. 3A and 3B, or by scaling the input signal to the divider network as shown in FIGS. 3C and 3D.

The shaping networks of the present invention shown in FIGS. 3A through 3D introduce a controlled amount of second order non-linearity to the voltage divider transfer function whereby the second order term opposes the first order linear term. It should be noted that, if desirable, the sign of the second order term may be changed by interchanging the source and drain connections in the configuration shown or by using a p-channel FET.

Referring again to FIGS. 3A-3D, if g(v) is the transfer function of resistive dividers 30 and 33, and A is the gain of amplifiers 35 and 36, then $$A = \frac{R_{ON} + \alpha R}{R_{ON}}$$

for amplifier 35a and 36a, where $$\alpha = 1 - \left(\frac{V_{GS}}{V_p}\right)$$

and $$A = \frac{\alpha R + R_{ON}}{R}$$

for amplifier 35b and 36b where $$g(v) = \mu(v + \beta v^2)$$

and generally $$A = \frac{1}{\mu} \quad (V_{GS} = 0)$$

There are several constraints on the shaping networks of the present invention. The first is $$|V_{in}| << |V_p| \frac{(R_{ON} + R)^2}{R_{ON} R}$$

This constraint is necessary to satisfy the assumptions underlying the series expansions of Exhibit A.

$$V_{DS} < |V_p|$$

This is a necessary condition for calculation of the drain current of the FET in the unsaturated region. If $V_{DS} > |V_p|$, the FET will saturate.

$$V_{DS} > -0.5 \text{ v}$$

This implies that $$V_{DS\ PK} < 0.5 \text{ v}.$$

If $$V_{DS} > -0.5 \text{ v},$$

the gate-drain junction will be forward biased and gate current will flow. The resultant current flow will dramatically alter the FET transfer function. Thus, this constraint is the most important to observe since $|V_p|$ is usually greater than 0.5 v.

EXHIBIT A

Figure 4:
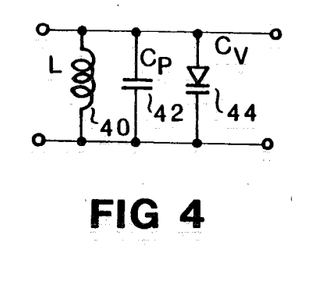
FIG. 4 is a schematic diagram of a typical oscillator tank circuit.

Referring to FIG. 4, the capacitance, $C_v$, of varactor 44 is given by:

$$C_v = C_c + \frac{C_o}{\left(1 + \frac{V_R}{\phi}\right)^\sigma}$$

where:
$C_c$ = Case capacitance
$C_o$ = Junction capacitance at $V_R = 0$ v
$\phi$ = Junction contact potential
$\sigma$ = Diode power Uw
$V_R$ = Diode reverse bias
Typically $\phi \approx 0.6$ v and $\sigma \approx 0.44$.

For simplicity, lump $C_c$ in with $C_p$ so that $C_p$ represents the total tank capacitance less the contribution of the varactor junction. The tank resonant frequency is:

$$f = \frac{1}{2\pi \sqrt{L\left(C_p + \frac{C_o}{\left(1 + \frac{V_o}{\phi}\right)^\sigma}\right)}}$$

$$\frac{df}{dV_R} = \frac{1}{2\pi \sqrt{L} \left(C_p + \frac{C_o}{\left(1 + \frac{V_R}{\phi}\right)^\sigma}\right)^{3/2}} \cdot$$

$$(-\tfrac{1}{2}) \frac{C_o}{\left(1 + \frac{V_R}{\phi}\right)^{[\sigma+1]}} \cdot -\frac{\sigma}{\phi}$$

Define $f_o$ as the normal osc. frequency, obtained when $V_R = V_o$ $$f_o \overset{\triangle}{=} \frac{1}{2\pi \sqrt{L\left(C_p + \left[\frac{C_o}{\left(1 + \frac{V_o}{\phi}\right)^\sigma}\right]\right)}}$$

-continued $$\frac{df}{dV_R} = \frac{1}{2\pi \sqrt{L\left(C_p + \frac{C_o}{\left[1 + \frac{V_R}{\phi}\right]^\sigma}\right)}} \cdot$$

$$\frac{\sigma C_o}{2\phi\left(C_p + \frac{C_o}{\left[1 + \frac{V_R}{\phi}\right]^\sigma}\right)} \cdot \frac{1}{\left(1 + \frac{V_R}{\phi}\right)^{\sigma+1}}$$

$$\left. \frac{df}{dV_R} \right|_{(V_R = V_o)} =$$

$$f_o \cdot \frac{\sigma C_o}{2\phi\left(1 + \frac{V_R}{\phi}\right)\left(C_p\left[1 + \frac{V_R}{\phi}\right]^\sigma + C_o\right)}$$

Example:
$L = 50$ mH  $\quad C_p = 9.77$ pf
$C_4 = 47$ pf  $\quad V_o = 40$ v $$C_4 = \frac{C_o}{\left(1 + \frac{4}{\phi}\right)^\sigma} \quad \therefore C_o = C_4\left(1 + \frac{4}{\phi}\right)^\sigma$$

Let $\phi = .6$ and $\sigma = .44$: $C_o = 47$ pf$\left(1 + \frac{4}{.6}\right)^{.44}$ $C_o = 115.17$ pf $$f_o = \frac{1}{2\pi \sqrt{50 \text{ mH} \left(9.77 \text{ pf} + \frac{115.17 \text{ pf}}{\left[1 + \frac{40}{.6}\right]^{.44}}\right)}} = 135.00 \text{ mHz}$$

$$\left. \frac{df}{dV_R} \right|_{(V_R = 40v)} =$$

$$\frac{135 \times 10^6 \times .44 \times 115.17 \text{ pf}}{2(.6)\left(1 + \frac{40}{.6}\right)\left(9.77 \text{ pf}\left[1 + \frac{40}{.6}\right]^{.44} + 115.17 \text{ pf}\right)}$$

$= 135 \times 10^6 \times 3.5143 \times 10^{-3}$ $= 474$ kHz/v

Figure 5:
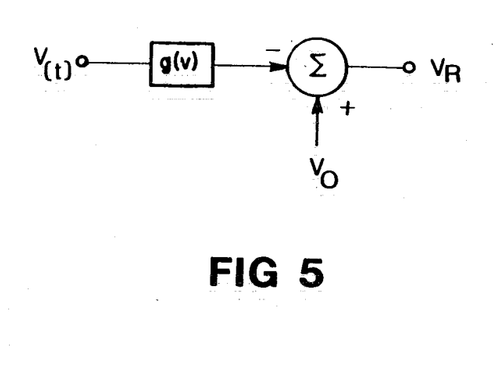
FIG. 5 is a block diagram including transfer function g(v).

Referring now to FIG. 5, assume modulating signal, v(t), is passed through shaping network, g(v), and summed with tune voltage, $V_o$.
Then:

$$f = \frac{1}{2\pi \sqrt{L\left(C_p + \frac{C_o}{\left[1 + \frac{V_o - g(v)}{\phi}\right]^\sigma}\right)}}$$

Let

-continued $$x = C_p + \frac{C_o}{\left[1 + \frac{V_o - g(v)}{\phi}\right]^\sigma}$$

$$\therefore f = \frac{1}{2\pi \sqrt{L x}}$$

$$\frac{df}{dv} = \frac{1}{2\pi \sqrt{L}} \cdot x^{-3/2}(-\tfrac{1}{2}) \frac{dx}{dg} \cdot \frac{dg}{dv}$$

The goal is to remove voltage dependance in (df/dv).
Note $v \triangleq v(t)$.
Thus, let $$\frac{df}{dv} = -K_v$$

$$\frac{-x^{-3/2}}{4\pi L} \cdot \frac{dx}{dv} = -K_v$$

$$\int \frac{-x^{-3/2}}{4\pi L} dx = -\int K_v dv$$

$$\frac{1}{4\pi L} \cdot \frac{x^{-1/2}}{-1/2} = -K_v V + \beta$$

where $\beta$ = constant of integration units = Hz $$\sqrt{x} = \frac{1}{2\pi \sqrt{L}(-K_v V + \beta)}$$

$$x = \frac{1}{4\pi^2 L(-K_v V + \beta)^2}$$

But $$x = C_p + \frac{C_o}{\left[1 + \frac{V_o - g(v)}{\phi}\right]^\sigma}$$

$$\therefore \frac{1}{4\pi^2 L(-K_v V + \beta)^2} = C_p + \frac{C_o}{\left[1 + \frac{V_o - g(v)}{\phi}\right]^\sigma}$$

$$\frac{C_o}{\left[1 + \frac{V_o - g(v)}{\phi}\right]^\sigma} = \frac{1}{4\pi^2 L(-K_v V + \beta)^2} - C_p$$

$$\left[1 + \frac{V_o - g(v)}{\phi}\right] = \left[\frac{C_o}{\frac{1}{4\pi^2 L(-K_v V + \beta)^2} - C_p}\right]^{1/\sigma}$$

$$g(v) = \phi\left[\frac{C_o}{\frac{1}{4\pi^2 L(-K_v V + \beta)^2} - C_p}\right]^{1/\sigma} - \phi - V_o$$

It is desirable that g(v)=0 when v(t)=0. Applying this constraint:

$$0 = -\phi\left[\frac{C_o}{\frac{1}{4\pi^2 L \beta^2} - C_p}\right]^{1/\sigma} + \phi + V_o$$

-continued $$1 + \frac{V_o}{\phi} = \left[\frac{C_o}{\frac{1}{4\pi^2 L \beta^2} - C_p}\right]^{1/\sigma}$$

$$\left(1 + \frac{V_o}{\phi}\right)^\sigma = \frac{C_o}{\frac{1}{4\pi^2 L \beta^2} - C_p}$$

$$\frac{1}{4\pi^2 L \beta^2} - C_p = \frac{C_o}{\left(1 + \frac{V_o}{\phi}\right)^\sigma}$$

Note that $\dfrac{C_o}{\left(1 + \dfrac{V_o}{\phi}\right)^\sigma}$ = varactor capacitance at average tune voltage.

Define: $C_{av} = \dfrac{C_o}{\left(1 + \dfrac{V_o}{\phi}\right)^\sigma}$ $$\frac{1}{4\pi^2 L \beta^2} - C_p = C_{av}$$

$$\frac{1}{4\pi^2 L \beta^2} = C_{av} + C_p$$

$$\beta^2 = \frac{1}{4\pi^2 L (C_{av} + C_p)}$$

$$\beta = \frac{1}{2\pi \sqrt{L(C_{av} + C_p)}} \therefore \beta = f_o$$

then $$g(v) = -\phi \left[\frac{C_o}{\frac{1}{4\pi^2 L (-K_v V + f_o)^2} - C_p}\right]^{1/\sigma} + \phi + V_o$$

Note that $K_v V$ represents the peak deviation of the modulated oscillator $\Delta f \ll f_o$.

$$g(v) = -\phi \left[\frac{C_o}{\frac{1}{4\pi^2 L (-K_v V + f_o)^2} - C_p}\right]^{1/\sigma} + \phi + V_o$$

Isolating the term $$\frac{1}{(-K_v V + f_o)^2},$$

performing a series expansion and retaining the first three terms of the expansion, $$\left(1 - \frac{K_v}{f_o} V\right)^{-2} \approx 1 + 2\frac{K_v}{f_o} V + 3\frac{K_v^2}{f_o^2} V^2$$

$$\therefore \frac{1}{(-K_v V + f_o)^2} \approx \frac{\left(1 + 2\frac{K_v}{f_o} V + 3\frac{K_v^2}{f_o^2} V^2\right)}{f_o^2}$$

Substituting into $g(v)$:

$$g(v) \approx -\phi \left[\frac{C_o}{\dfrac{\left(1 + 2\dfrac{K_v}{f_o} V + 3\dfrac{K_v^2}{f_o^2} V^2\right)}{4\pi^2 L f_o^2} - C_p}\right]^{1/\sigma} + \phi + V_o$$

Previously, $$\frac{1}{4\pi^2 L f_o^2} = C_p + C_{av}.$$

Thus:

$$g(v) \approx -\phi \left[\frac{C_o}{(C_{av} + C_p)\left[1 + 2\dfrac{K_v}{f_o} V + 3\dfrac{K_v^2}{f_o^2} V^2\right] - C_p}\right]^{1/\sigma} + \phi + V_o$$

$$= -\phi \left[\frac{C_o}{C_{av} + (C_{av} + C_p)\left[2\dfrac{K_v}{f_o} V + 3\dfrac{K_v^2}{f_o^2} V^2\right]}\right]^{1/\sigma} + \phi + V_o$$

$$= -\phi \left(\frac{C_o}{C_{av}}\right)^{1/\sigma} \left[\frac{1}{1 + \left(1 + \dfrac{C_p}{C_{av}}\right)\left(2\dfrac{K_v V}{f_o} + 3\dfrac{K_v^2}{f_o^2} V^2\right)}\right]^{1/\sigma} + \phi + V_o$$

The term in brackets is of the form:

$$(1 + av + bv^2)^{-1/\sigma}$$

where:

$$a = 2 \frac{K_v}{f_o} \left(1 + \frac{C_p}{C_{av}}\right)$$

$$b = 3 \frac{K_v^2}{f_o^2} \left(1 + \frac{C_p}{C_{av}}\right)$$

Let $f(v) = (1 + av + bv^2)^{-1/\sigma}$ $f(o) = 1$ $f'(v) = -\frac{1}{\sigma}(1 + av + bv^2)^{-1/\sigma - 1} \cdot (a + 2bv)$ $f'(o) = -\frac{a}{\sigma}$ $f''(v) =$ $$\frac{1}{\sigma}\left(\frac{1+\sigma}{\sigma}\right)(1 + av + bv^2)^{-1/\sigma - 2}(a + 2bv)^2 -$$

$$\frac{1}{\sigma}(1 + av + bv^2) - \left(\frac{1+\sigma}{\sigma}\right)(2b)$$

$f''(o) = \frac{1+\sigma}{\sigma^2} a^2 - \frac{2b}{\sigma}$ $f(v) = f(o) + \frac{f'(o)}{1!} v + \frac{f''(o)}{2!} v^2 + \frac{f'''(o)}{3!} v^3 + \ldots$ $f(v) = 1 - \frac{a}{\sigma} v + \left(\frac{1+\sigma}{\sigma^2} a^2 - \frac{2b}{\sigma}\right) \frac{v^2}{2} + \ldots$ I shall keep only the first three terms since I am looking for a quadratic approximation.

$$g(v) \approx -\phi \left(\frac{C_o}{C_{av}}\right)^{1/\sigma} \left[1 - \frac{2K_v}{\sigma f_o}\left(1 + \frac{C_p}{C_{av}}\right) v + \right.$$

$$\left\{\frac{1+\sigma}{\sigma^2}\left(\frac{2K_v}{f_o}\left[1 + \frac{C_p}{C_{av}}\right]\right)^2 - \right.$$

$$\left.\left.\frac{6K_v^2}{\sigma f_o^2}\left[1 + \frac{C_p}{C_{av}}\right]\right\} \frac{v^2}{2}\right] + \sigma + V_o$$

Previously, it was shown that:

$$\phi \left(\frac{C_o}{C_{av}}\right)^{1/\sigma} = (\phi + V_o)$$

$$\therefore g(v) \approx -(V_o + \phi)\left[\frac{-2K_v}{\sigma f_o}\left(1 + \frac{C_p}{C_{av}}\right) v + \right.$$

$$\left\{\frac{1+\sigma}{\sigma^2} \frac{4K_v^2}{f_o^2}\left(1 + \frac{C_p}{C_{av}}\right)^2 - \right.$$

-continued $$\left.\left.\frac{6K_v^2}{\sigma f_o^2}\left(1 + \frac{C_p}{C_{av}}\right)\right\} \frac{v^2}{2}\right]$$

Previously, it was shown that:

$$\frac{2K_v}{\sigma f_o}\left(1 + \frac{C_p}{C_{av}}\right)(V_o + \phi) = 1$$

Using this result:

$$g(v) \approx v - \frac{4K_v^2}{\sigma^2 f_o^2}\left(1 + \frac{C_p}{C_{av}}\right)^2 (V_o + \phi)^2 \left[\frac{1 + \sigma}{(V_o + \phi)} - \right.$$

$$\left.\frac{6\sigma}{4\left(1 + \frac{C_p}{C_{av}}\right)(V_o + \phi)}\right] \frac{v^2}{2}$$

$$= v - \frac{1}{V_o + \phi}\left(\frac{1 + \sigma}{2} - \frac{3\sigma}{4\left(1 + \frac{C_p}{C_{av}}\right)}\right) v^2$$

$$g(v) \approx v - \left[\frac{1 + \sigma}{2} - \frac{3\sigma}{4\left(1 + \frac{C_p}{C_{av}}\right)}\right] \frac{v^2}{\phi + V_o}$$

This is the required second order shaping.

EXHIBIT B

Figure 6:
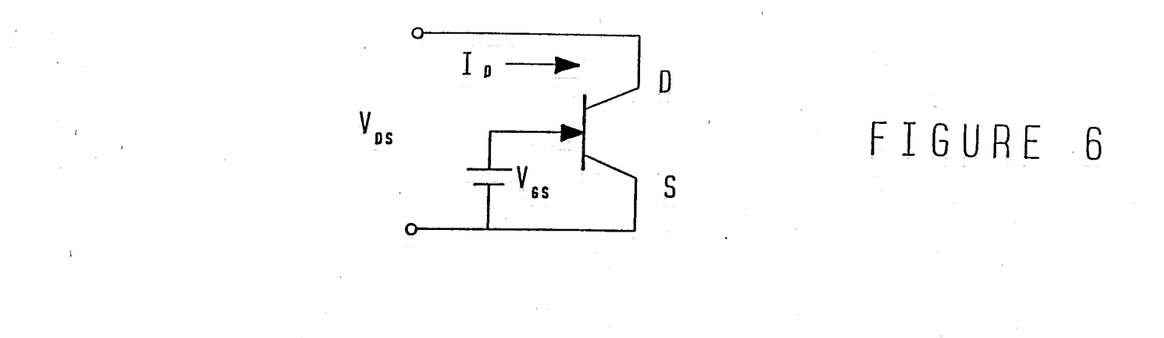
FIG. 6 is a schematic diagram of an FET biased to operate in its linear region.
Figure 7:
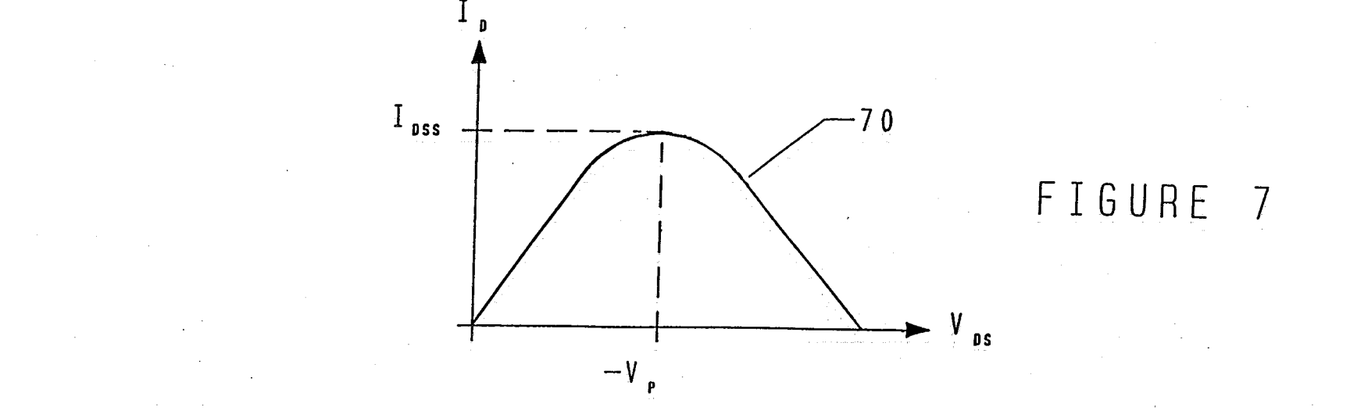
FIG. 7 is a diagram of $V_{DS}$-$I_D$ characteristics curve of an FET for operation in the unsaturated region.

Referring to FIG. 6, for a symmetrical junction FET, the most positive junction controls the current flow, $I_D$, in an N-channel device. A quadratic approximation of unsaturated drain current can be derived by assuming the substantially parabolic characteristic curve 70 as shown in FIG. 7. Thus, $$I_D = \frac{2I_{DSS}}{V_p^2} V_{DS}\left(V_{GS} - V_p - \frac{V_{DS}}{2}\right)$$

Since the same relation describes the behavior of $I_D$ in both quadrants 1 and 3, $$r_{DS\,ON} \triangleq \left.\frac{dV_{DS}}{dI_D}\right|_{V_{DS}=0}$$

$$\frac{dV_{DS}}{dI_D} = \frac{1}{dI_D/dV_{DS}}$$

$$\frac{dI_D}{dV_{DS}} = \frac{2I_{DSS}}{V_p^2}\left(V_{GS} - V_p - \frac{V_{DS}}{2}\right) + \frac{2I_{DSS}}{V_p^2} V_{DS}(-\tfrac{1}{2})$$

$$\left.\frac{dI_D}{dV_{DS}}\right|_{V_{DS}=0} = \frac{2I_{DSS}}{V_p^2}(V_{GS} - V_p)$$

-continued $$r_{DS\,ON} = \frac{V_p^2}{2I_{DSS}(V_{GS} - V_p)}$$

$$R_{ON} = r_{DS\,ON}|_{V_{GS}=0} = \frac{-V_p}{2I_{DSS}}$$

$$I_D = \frac{-V_{DS}}{R_{ON}V_p}\left(V_{GS} - V_p - \frac{V_{DS}}{2}\right)$$

Let $V \triangleq V_{GS} - V_p$ $$I_D = \frac{-V_{DS}}{R_{ON}V_p}\left(V - \frac{V_{DS}}{2}\right)$$

For resistive voltage dividers 30, $$V_{IN} = -I_D R - V_{DS}$$

$$V_{IN} = (-R)\left(\frac{-V_{DS}}{R_{ON}V_p}\left[V - \frac{V_{DS}}{2}\right]\right) - V_{DS}$$

$$= \frac{R}{R_{ON}V_p}\left(V_{DS}V - \frac{V_{DS}^2}{2}\right) - V_{DS}$$

$$V_{IN}\frac{R_{ON}V_p}{R} = V_{DS}V - \frac{V_{DS}^2}{2} - V_{DS}\frac{R_{ON}V_p}{R}$$

-continued $$V_{DS}^2 - 2V_{DS}V + 2V_{DS}\frac{R_{ON}V_p}{R} = -2V_{IN}\frac{R_{ON}V_p}{R}$$

$$V_{DS}^2 + V_{DS}\left(\frac{2R_{ON}}{R}V_p - 2V\right) + \frac{2R_{ON}}{R}V_{IN}V_p = 0$$

At this point, note that $V_p \leq V_{GS} \leq 0$. Therefore, $V = V_{GS} - V_p$. $0 \leq V \leq -V_p$ Let $V = -\alpha V_p$; where $0 \leq \alpha \leq 1$. Note, $\alpha = 0$ when $V_{GS} = V_p$, and $\alpha = 1$ when $V_{GS} = 0$ v.

$$V_{DS}^2 + V_{DS}\left(\frac{2R_{ON}}{R}V_p + 2\alpha V_p\right) + \frac{2R_{ON}}{R}V_{IN}V_p = 0$$

$$V_{DS} = \frac{-\left(\frac{2R_{ON}}{R}V_p + 2\alpha V_p\right) \pm \sqrt{\left(\frac{2R_{ON}}{R}V_p + 2\alpha V_p\right)^2 - 8\frac{R_{ON}}{R}V_{IN}V_p}}{2}$$

If $V_{IN} = 0$, $V_{DS}$ must $= 0$. $V_p < 0$ and $$\left(\frac{R_{ON}}{R} + \alpha\right) > 0.$$

Therefore, $$-2V_p\left(\frac{R_{ON}}{R} + \alpha\right) > 0.$$

Since the square root will be positive, the negative radical must be taken.

$$V_{DS} = \frac{\left(\frac{2R_{ON}}{R}V_p + 2\alpha V_p\right) - \sqrt{\left[2V_p\left(\frac{R_{ON}}{R} + \alpha\right)\right]^2 - \frac{8R_{ON}V_{IN}}{R}V_p}}{2}$$

$$= -V_p\left(\alpha + \frac{R_{ON}}{R}\right) - \sqrt{\left[V_p\left(\frac{R_{ON}}{R} + \alpha\right)\right]^2 - \frac{2R_{ON}}{R}V_{IN}V_p}$$

$$= -V_p\left(\alpha\frac{R + R_{ON}}{R}\right) - \sqrt{\left[V_p\left(\frac{R_{ON} + \alpha R}{R}\right)\right]^2 - \frac{2R_{ON}V_{IN}}{R}V_p}$$

$$= -V_p\left(\frac{\alpha R + R_{ON}}{R}\right)\left[+1 + \sqrt{1 - \frac{2R_{ON}V_{IN}V_p R^2}{RV_p^2(R_{ON} + \alpha R)^2}}\right]$$

$$= -V_p\left(\frac{\alpha R + R_{ON}}{R}\right)\left[+1 - \sqrt{1 - \frac{2R_{ON}RV_{IN}}{V_p(R_{ON} + \alpha R)^2}}\right] \quad \text{``K''}$$

Assume $R \gg R_{ON}$. Then the radical becomes:

$$\sqrt{1 - \frac{\frac{2R_{ON}}{R}}{\left(\alpha + \frac{R_{ON}}{R}\right)^2} \frac{V_{IN}}{V_p}}$$

Perform a series expansion and retain the first three terms.

$$v_{DS} \approx -V_p\left(\frac{\alpha R + R_{ON}}{R}\right)\left[+1 - \left(1 - \frac{2R_{ON}R \cdot \frac{1}{2}}{V_p(R_{ON} + \alpha R)^2} \cdot v_{IN} - \frac{4R_{ON}^2R^2 \cdot \frac{1}{8}}{V_p^2(R_{ON} + \alpha R)^4} \cdot v_{IN}^2\right)\right]$$

$$= -V_p\left(\frac{\alpha R + R_{ON}}{R}\right)\left[+\frac{R_{ON}R}{V_p(R_{ON} + \alpha R)^2} \cdot v_{IN} + \frac{R_{ON}^2R^2}{2V_p^2(R_{ON} + \alpha R)^4} \cdot v_{IN}^2\right]$$

$$= -\frac{R_{ON}}{R_{ON} + \alpha R} \cdot v_{IN} - \frac{R_{ON}^2 R}{2V_p(R_{ON} + \alpha R)^3} \cdot v_{IN}^2$$

$v_{OUT} = -v_{DS}$

So:

$$v_{OUT} = \frac{R_{ON}}{R_{ON} + \alpha R} \cdot v_{IN} + \frac{R_{ON}^2 R}{2V_p(R_{ON} + \alpha R)^3} \cdot v_{IN}^2$$

If $\alpha = 1 \Rightarrow V_{GS} = 0$ $$v_{OUT} = \frac{R_{ON}}{R_{ON} + R} \cdot v_{IN} + \frac{R_{ON}^2 R}{2V_p(R_{ON} + R)^3} \cdot v_{IN}^2$$

Note that $V_p < 0$ $$\therefore v_{OUT} = \frac{R_{ON}}{R_{ON} + R} \cdot v_{IN} - \frac{R_{ON}^2 R}{2(R_{ON} + R)^3 |V_p|} \cdot v_{IN}^2$$

For this approximation to be valid, $$|v_{IN}| << |V_p| \frac{2(R_{ON} + \alpha R)^2}{2R_{ON}R} \quad \text{``M''}$$

Since a resistive-voltage divider attenuates the input voltage, all input voltages must be pre-amplified by an amount approximately equal to $$\frac{R_{ON} + R}{R_{ON}}$$

to restore to the amplitude of the output signal if a post shaping network amplifier is not used.

EXHIBIT C

For resistive voltage divider 33, $v_{IN} = I_D R + v_{DS} \quad v_{OUT} = v_{IN} - v_{DS}$ -continued As before, $I_D = \frac{-V_{DS}}{R_{ON}V_p}\left(V - \frac{V_{DS}}{2}\right)$ $V \triangleq V_{GS} - V_p$ As previously stated, let $V = -\alpha V_p$ $$v_{IN} = \frac{Rv_{DS}}{R_{ON}V_p}\left(\alpha V_p + \frac{v_{DS}}{2}\right) + v_{DS}$$

$$= \frac{R}{R_{ON}} v_{DS}\alpha + \frac{Rv_{DS}^2}{2R_{ON}V_p} + v_{DS}$$

$$\frac{2R_{ON}}{R} V_p v_{IN} = 2V_p v_{DS}\alpha + v_{DS}^2 + \frac{2R_{ON}}{R} V_p v_{DS}$$

$$v_{DS}^2 + v_{DS}\left(2V_p\alpha + \frac{2R_{ON}}{R} V_p\right) - \frac{2R_{ON}V_p}{R} v_{IN} = 0$$

$$v_{DS} = \frac{-2V_p\left(\alpha + \frac{R_{ON}}{R}\right) \pm \sqrt{\left(2V_p\left[\alpha + \frac{R_{ON}}{R}\right]\right)^2 + \frac{8R_{ON}V_p v_{IN}}{R}}}{2}$$

$$= -V_p\left(\frac{\alpha R + R_{ON}}{R}\right) \pm$$

$$\sqrt{\left(V_p\left[\frac{\alpha R + R_{ON}}{R}\right]\right)^2 + \frac{2R_{ON}V_p v_{IN}}{R}}$$

The negative radical must be used so that $v_{DS}=0$ v when $v_{IN}=0$ v.

$$v_{DS} = -V_p\left(\frac{\alpha R + R_{ON}}{R}\right)\left[1 - \sqrt{1 + \frac{2R_{ON}V_p v_{IN}}{R} \cdot \frac{R^2}{(\alpha R + R_{ON})^2 V_p^2}}\right]$$

$$= -V_p\left(\frac{\alpha R + R_{ON}}{R}\right)\left[1 - \sqrt{1 + \frac{2R_{ON}R v_{IN}}{(\alpha R + R_{ON})^2 V_p}}\right]$$

The radical has the same form as the radical in equation "K" for resistive voltage divider 30. Therefore, isolating and applying condition "M", $$f(v) \approx 1 + \frac{R_{ON}R}{(\alpha R + R_{ON})^2} \cdot \frac{v_{IN}}{V_p} - \frac{R_{ON}^2 R^2 v^2}{2(\alpha R + R_{ON})^4 V_p^2}$$

$$v_{DS} \approx -V_p\left(\frac{\alpha R + R_{ON}}{R}\right)\left[1 - \left(1 + \frac{R_{ON}R}{(\alpha R + R_{ON})^2} \cdot \frac{v_{IN}}{V_p} - \frac{R_{ON}^2 R^2 v_{IN}^2}{2(\alpha R + R_{ON})^4 V_p^2}\right)\right]$$

-continued $$= -V_p\left(\frac{\alpha R + R_{ON}}{R}\right)\left[\frac{-R_{ON}R}{(\alpha R + R_{ON})^2} \cdot \frac{v_{IN}}{V_p} + \frac{R_{ON}^2 R^2 v_{IN}^2}{2(\alpha R + R_{ON})^4 V_p^2}\right]$$

$$= \frac{R_{ON}v_{IN}}{(\alpha R + R_{ON})} - \frac{R_{ON}^2 R v_{IN}^2}{2(\alpha R + R_{ON})^3 V_p}$$

Remember that $$v_{OUT} = v_{IN} - v_{DS}$$

$$\Rightarrow v_{OUT} = v_{IN} - \frac{R_{ON}v_{IN}}{\alpha R + R_{ON}} + \frac{R_{ON}^2 R v_{IN}^2}{2(\alpha R + R_{ON})^3 V_p}$$

$$= \frac{\alpha R}{\alpha R + R_{ON}} \cdot v_{IN} + \frac{R_{ON}^2 R v_{IN}^2}{2(\alpha R + R_{ON})^3 V_p}$$

But $V_p < 0$;

$$v_{OUT} = \frac{\alpha R}{\alpha R + R_{ON}} \cdot v_{IN} - \frac{R_{ON}^2 R v_{IN}^2}{2|V_p|(\alpha R + R_{ON})^3}$$

$$= \frac{\alpha R}{\alpha R + R_{ON}} \cdot \left(v_{IN} - \frac{R_{ON}^2 v_{IN}^2}{2\alpha |V_p|(\alpha R + R_{ON})^2}\right)$$

If $$\alpha = 1 \text{ (i.e. } V_{GS} = 0)$$

$$\Rightarrow$$

$$v_{OUT} = \frac{R}{R + R_{ON}} \cdot \left(v_{IN} - \frac{R_{ON}^2}{2|V_p|(R + R_{ON})^2} v_{IN}^2\right)$$

I claim:

1. A network for reducing distortion in the modulation of the output signal of a voltage controlled oscillator, said network comprising a voltage divider coupled to the voltage controlled oscillator for shaping a modulation signal, the network having a characteristic transfer function, said voltage divider including a semiconductor device biased for unsaturated non-linear operation for providing a controllable non-linear resistance, said semiconductor device introducing a controlled amount of second order non-linearity to said characteristic transfer curve.

2. A network as in claim 1 wherein said characteristic transfer function thereof is given by the relation:

$$V_{out} = \frac{R_{ON}}{R_{ON} + R} \cdot V_{in} - \left[\frac{R_{ON}^2 R}{2|V_p|(R_{ON} + R)^3}\right] V_{in}^2.$$

3. A network as in claim 2 wherein said semiconductor device comprises a field effect transistor.

4. A network as in claim 3 wherein said voltage divider further includes at least one resistor.

5. A network as in claim 2 further comprising a voltage amplifier having a predetermined gain, said voltage amplifier coupled between said voltage divider and said voltage controlled oscillator for amplifying said modulation signal.

6. A network as in claim 5 wherein said semiconductor device comprises a field effect transistor.

7. A network as in claim 6 wherein said voltage divider further includes at least one resistor.

8. A network as in claim 1 wherein said characteristic transfer function thereof is given by the relation:

$$V_{out} = \frac{R}{R + R_{ON}} \cdot \left[V_{in} - \frac{R_{ON}^2}{2|V_p|(R + R_{ON})^2} V_{in}^2\right].$$

9. A network as in claim 8 wherein said semiconductor device comprises a field effect transistor.

10. A network as in claim 9 wherein said voltage divider further includes at least one resistor.

11. A network as in claim 8 further comprising a voltage amplifier having a predetermined gain, said voltage amplifier coupled between said voltage divider and said voltage controlled oscillator for amplifying said modulation signal.

12. A network as in claim 11 wherein said semiconductor device comprises a field effect transistor.

13. A network as in claim 12 wherein said voltage divider further includes at least one resistor.

* * * * *